United States Patent [19]
Young et al.

[11] Patent Number: 5,677,638
[45] Date of Patent: Oct. 14, 1997

[54] HIGH SPEED TRISTATE BUS WITH MULTIPLEXERS FOR SELECTING BUS DRIVER

[75] Inventors: Steven P. Young, San Jose; Kamal Chaudhary, Milpitas, both of Calif.

[73] Assignee: Xilinx, Inc., San Jose, Calif.

[21] Appl. No.: 595,676

[22] Filed: Feb. 2, 1996

[51] Int. Cl.$^6$ .................................................. H03K 19/177
[52] U.S. Cl. .................................................. 326/39
[58] Field of Search ........................... 326/85, 86, 39

[56] References Cited

U.S. PATENT DOCUMENTS

| | | | |
|---|---|---|---|
| Re. 34,363 | 8/1993 | Freeman . | |
| 5,376,844 | 12/1994 | Pedersen et al. | 326/39 |
| 5,506,517 | 4/1996 | Tsui et al. | 326/39 |
| 5,600,264 | 2/1997 | Duong et al. | 326/39 |

OTHER PUBLICATIONS

"The Programmable Logic Data Book", 1994, available from Xilinx, Inc., 2100 Logic Drive, San Jose, CA 95124, pp. 2–16 through 2–24.

"The XC5200 Logic Cell Array Family Technical Data", Oct. 1995, available from Xilinx, Inc., 2100 Logic Drive, San Jose, CA 95124, pp. 1 through 20.

*Primary Examiner*—Edward P. Westin
*Assistant Examiner*—Richard Roseen
*Attorney, Agent, or Firm*—Edel M. Young

[57] ABSTRACT

According to the invention, a structure is provided for driving a bus line that is both fast and small. Instead of a plurality of tristate buffers, one for each input signal, a plurality of multiplexers is connected into a chain. The tristate enable line of the tristate buffer becomes the control line for enabling the multiplexer to place its own input signal into the chain instead of propagating the signal already in the chain. A buffer element then drives the resulting signal onto an output line of the chain. One embodiment of the invention includes lookahead logic similar to a lookahead carry chain. This allows large numbers of input lines to be connected to a bus line while retaining high speed. An embodiment implements the lookahead feature using AND gates and OR gates and thereby further increases speed and reduces size.

7 Claims, 9 Drawing Sheets

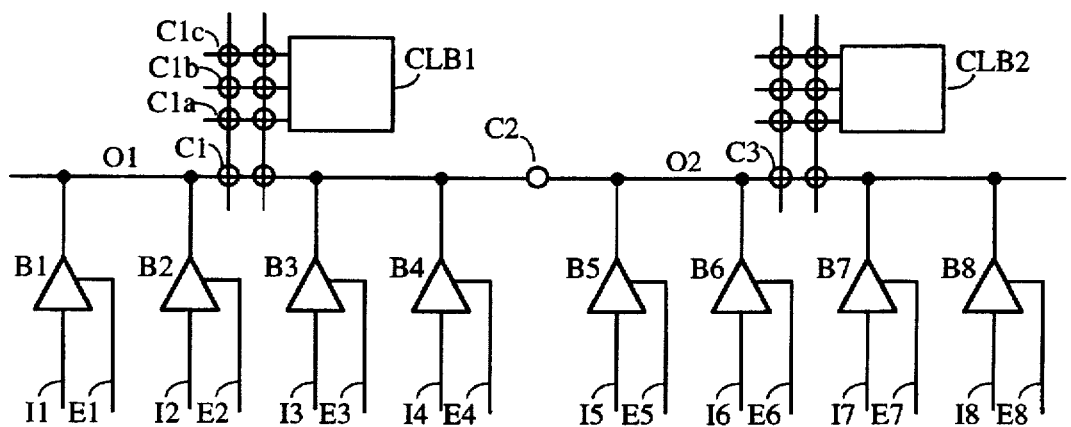
FIG. 1
Prior Art
● = Permanent Connection
○ = Programmable Connection, Not Connected
● = Programmable Connection, Connected
FIG. 2
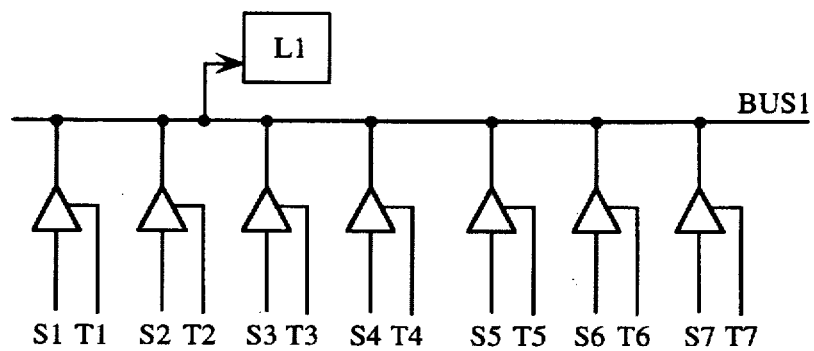
FIG. 3
Prior Art
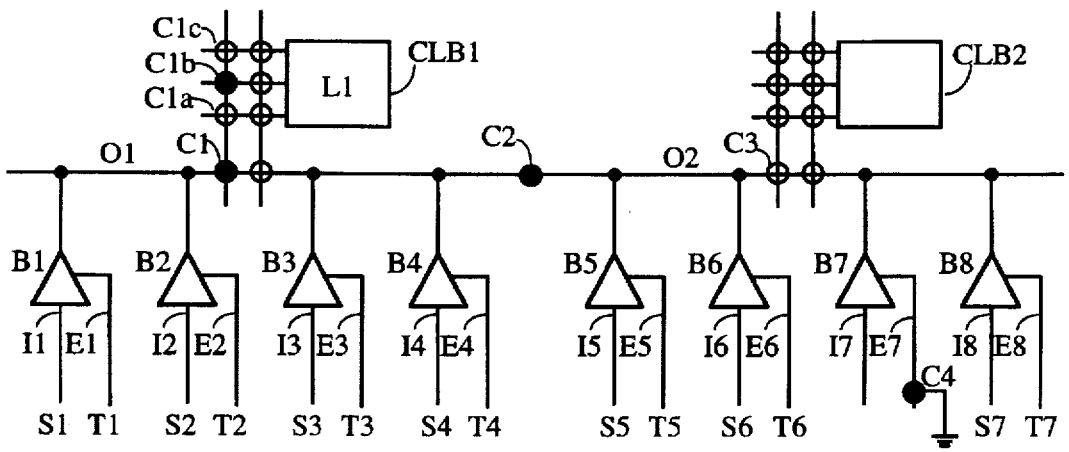
FIG. 4
Prior Art

HIGH SPEED TRISTATE BUS WITH MULTIPLEXERS FOR SELECTING BUS DRIVER

FIELD OF THE INVENTION

The invention relates to programmable integrated circuit devices, particularly FPGAs, and to controlling input signals for driving a bus.

BACKGROUND OF THE INVENTION

The overall structure of an FPGA is described by Freeman in U.S. Pat. No. Re. 34,363. An FPGA includes configurable logic blocks and a configurable interconnect structure for connecting the logic blocks and otherwise routing signals through the FPGA. An FPGA may be configured to perform a particular function by turning on and off particular transistors in the FPGA to select functions performed by the logic blocks of the FPGA and to connect the logic blocks to each other through interconnect lines. One FPGA architecture with which the present invention will work is described by Tavana et al in U.S. patent application Ser. No. 08/222,138 [M-2257-1N] entitled FPGA Architecture with Repeatable Tiles Including Routing Matrices and Logic Matrices. The subject matter of this patent application is incorporated herein by reference.

It is common to use a single bus line for alternatively providing one of several signals to a circuit element. When a bus line is used, a control system must assure that only one driver uses the bus at one time. (A bus line may alternatively be used to provide a signal from a single source, or may be used to generate a wired-AND function by connecting a pull-up resistor and many pull-down signal sources of which none or many may be connected simultaneously.) FPGA integrated circuit chips having a tristate buffer structure for alternately placing multiple signals onto one bus line are available in the XC4000 and XC5200 families of devices available from Xilinx, Inc., assignee of the present invention. The tristate buffer feature of the Xilinx XC4000 family of products is described in the Xilinx 1994 Data Book at pages 2–16 and 2–24. The XC5200 family is illustrated in the XC5200 Logic Cell Array Family Technical Data published Oct. 1995, pages 1–20. The tristate buffer is illustrated at pages 5 and 11.

In the Xilinx XC4000 and XC5200 families of FPGA devices, certain of the interconnect lines can serve as bus lines. Output terminals of several tristate buffers are connected to these lines and a control structure is present in the FPGA for selecting which tristate buffer places its signal onto the interconnect line.

FIG. 1 shows a tristate buffer structure including two line segments O1 and O2 which may or may not be connected together using programmable connector C2 to form a single bus line, and eight tristate buffers B1 through B8 for alternatively driving the line segments. Each buffer B1 through B8 typically receives an input signal from a different configurable logic block of the FPGA. (These configurable logic blocks are not shown in FIG. 1.) The bus line segments O1 and O2 can also be connected to terminals of configurable logic blocks via local interconnect line segments. FIG. 1 shows two configurable logic blocks, CLB1 and CLB2, which can be programmably connected to line segments O1 and O2 respectively. Programmable connectors such as C1, C1a, C1b, C1c, and C3 make these connections. Also, programmable connector C2 connects line segments O1 and O2 together. A control system, not shown, places an enable signal (may be active high or active low) on a selected tristate enable line E1 through E8 and thereby connects the selected input line I1 through I8 to its corresponding bus line segment O1 or O2. If programmable connector C2 is not connecting segments O1 and O2 together, each segment may receive its own driving signal.

FIG. 2 shows symbols used in the drawings, including a small black dot to indicate a permanent connection, a white circle to indicate a programmable connection not connected, and a black circle to indicate a programmable connection that is connected.

FIG. 3 shows part of a logic design which a user may wish to implement in an FPGA. In this example, the design has seven signals S1 through S7 to be alternatively placed onto a bus BUS1, which provides an input signal to a logic unit L1. Software is available to receive a user's design, including a structure such as illustrated in FIG. 3, and to select components of an FPGA which will implement each portion of the design. This software typically partitions the user's design into portions which will be implemented in a CLB and its related tristate buffers (called partitioning or mapping), then selects particular CLBs and tristate buffers to implement each portion (called placement), and finally selects interconnect lines to connect the pieces together according to the user's design (called routing). Sometimes, because of other logic not shown in FIG. 3, the placement step may choose to skip a tristate buffer when placing the logic for generating signals S1 through S7.

FIG. 4 shows an example implementation of the user's design of FIG. 3 in the FPGA structure of FIG. 1. In order to alternatively connect seven signal lines to the same bus, segments O1 and O2 are connected together by turning on connector C2. The user's logic represented in FIG. 3 by L1 is implemented in FIG. 4 by CLB1. Thus connectors C1 and C1b are turned on to connect segment O1 to CLB1. Connector C3 is not turned on, since CLB2 is not used to implement the design of FIG. 3. Because of placement and possible other considerations, the signal S7 of FIG. 3 will be generated in a non-contiguous logic block and placed onto signal line S8. Thus, buffer B7 is disabled by connecting enable line E7 to ground through connector C4. During operation, the control structure (not shown) places a high signal onto one of E1 through E6 and E8 to turn on one of the corresponding buffers B1 through B6 and B8. The selected signal S1 through S7 placed on line I1 through I6 and I8 is then provided to CLB1.

The structure of FIGS. 1 and 4 requires that each of buffers B1 through B8 be of sufficient size to drive any other circuit elements that may be connected to bus lines O1 and O2. If many input signals may be buffered onto the bus and many circuit elements may be driven by the bus, the size of the structure of FIG. 1 can be undesirably large or else the speed of signal propagation can be undesirably slow.

SUMMARY OF THE INVENTION

According to the invention, a structure is provided for driving a bus line that is both fast and small. Instead of a plurality of tristate buffers, one for each input signal, a plurality of multiplexers is connected into a chain. The tristate enable line of the tristate buffer becomes the control line for enabling the multiplexer to place its own input signal into the chain instead of propagating the signal already in the chain. A buffer element then drives the resulting signal onto an output line of the chain.

One embodiment of the invention includes lookahead logic similar to a lookahead carry chain. This allows large numbers of input lines to be connected to a bus line while retaining high speed. An embodiment implements the lookahead feature using AND gates and OR gates and thereby further increases speed and reduces size.

BRIEF DESCRIPTION OF THE DRAWINGS

FIG. 1 shows a prior art tristate buffer structure for driving a bus.

FIG. 2 shows symbols used in the drawings.

FIG. 3 shows part of a logic design which a user may wish to implement in an FPGA.

FIG. 4 shows an example implementation of the user's design of FIG. 3 in the prior art FPGA structure of FIG. 1.

DETAILED DESCRIPTION OF THE DRAWINGS

Figure 5:
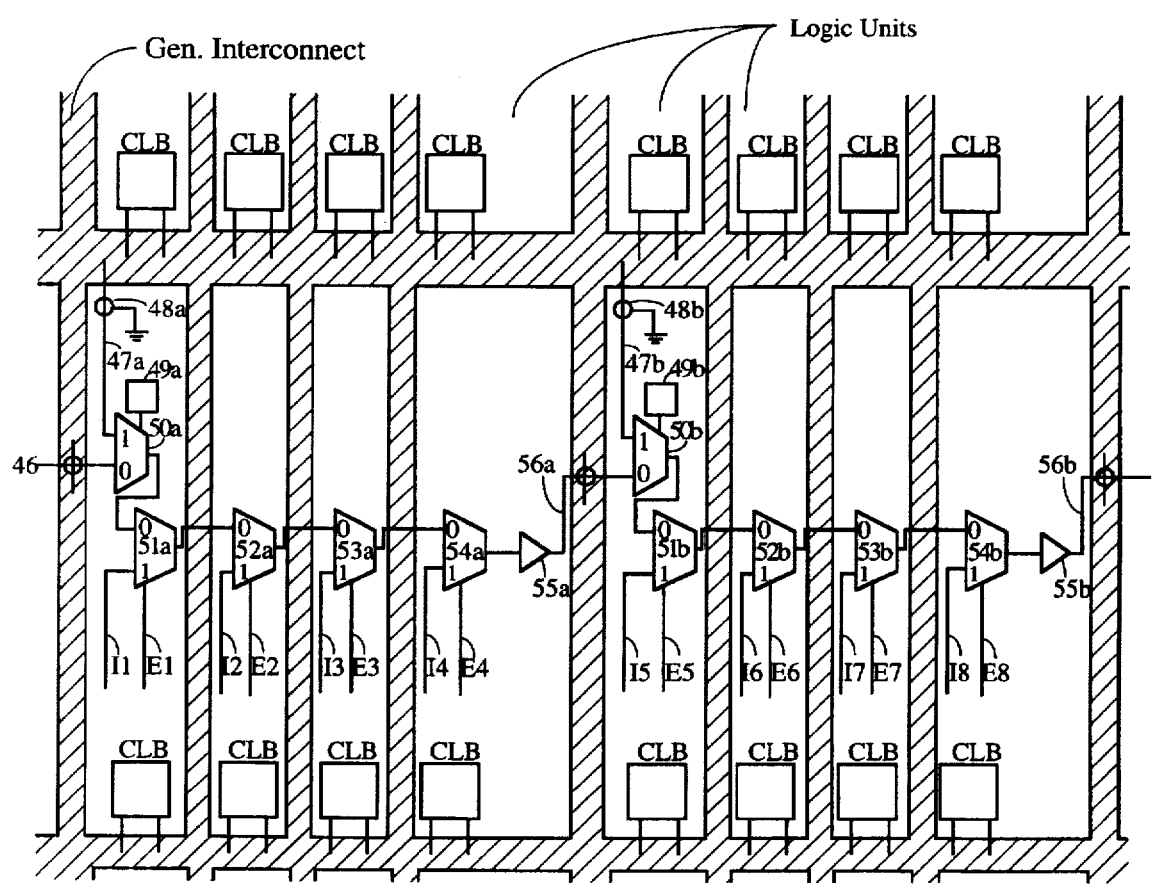
FIG. 5 shows a bus structure according to the invention.

FIG. 5 shows a bus structure according to the invention implemented within a FPGA structure. Shaded regions indicate the interconnect structure of the FPGA. In a commercial device, many more programmable connections than those shown are available. In order to avoid cluttering the drawing, only a minimum number have been shown. Illustrated between the interconnect regions are logic units in which are positioned configurable logic blocks labeled CLB. The bus structure makes use of both lines in the general interconnect and multiplexers in the logic units. A first multiplexer chain comprises multiplexers 50a–54a and buffer 55a. A second chain comprises multiplexers 50b–54b and buffer 55b. Multiplexer 50a can receive an input signal on line 46 from another chain to the left, not shown, or can receive a signal on line 47a from the general interconnect structure. For starting a chain, a ground signal can also be applied to line 47a. Multiplexer 50a is controlled by a memory cell 49a. A logic 1 in memory cell 49a causes the signal on line 47a to be forwarded to multiplexer 51a. A logic 0 in memory cell 49a causes the chain to continue from line 46. If no enable signal on line E1 through E4 is a logic 1, then the output signal from multiplexer 50a is forwarded to buffer 55a and placed onto bus line 56a. If any enable signal on line E1 through E4 is logic 1, then the signal on the corresponding multiplexer input line I1 through I4 is placed onto bus 56a. There should be only one logic 1 enable signal among all enable signals for driving one bus. If this is the case, then the multiplexer chain will forward the input signal associated with that logic 1 to the output bus. If, through a design error or other reason, more than one enable signal is high, there will be no signal contention, in contrast to the prior art tristate buffer structure. The rightmost signal will be applied to the output bus line 56a. No damage will be done to the chip by this action, in contrast to the prior art structure of tristate buffers.

In any sequence of chains comprising a bus line, the first chain will be initialized to logic 0, for example via connector 48a. Thus, if none of the enable signals E1 through E4 is high, the logic 0 will propagate through the chain and the output will be logic 0. The second chain can be connected to the first chain by placing logic 0 into memory cell 49b. This allows eight input signals to drive a single output bus line 56b. An actual FPGA will typically include many adjacent units with the same structure. Thus a very large number of input signals can be alternatively selected to drive one bus line. And many separate buses can be constructed from these adjacent units. Also, using input line 47 (47a, 47b, for example), allows an output signal on a bus line 56 (56a, 56b, for example) to be connected to a non-adjacent chain. Thus multiple non-adjacent chains can be joined to form one bus line.

Figure 6:
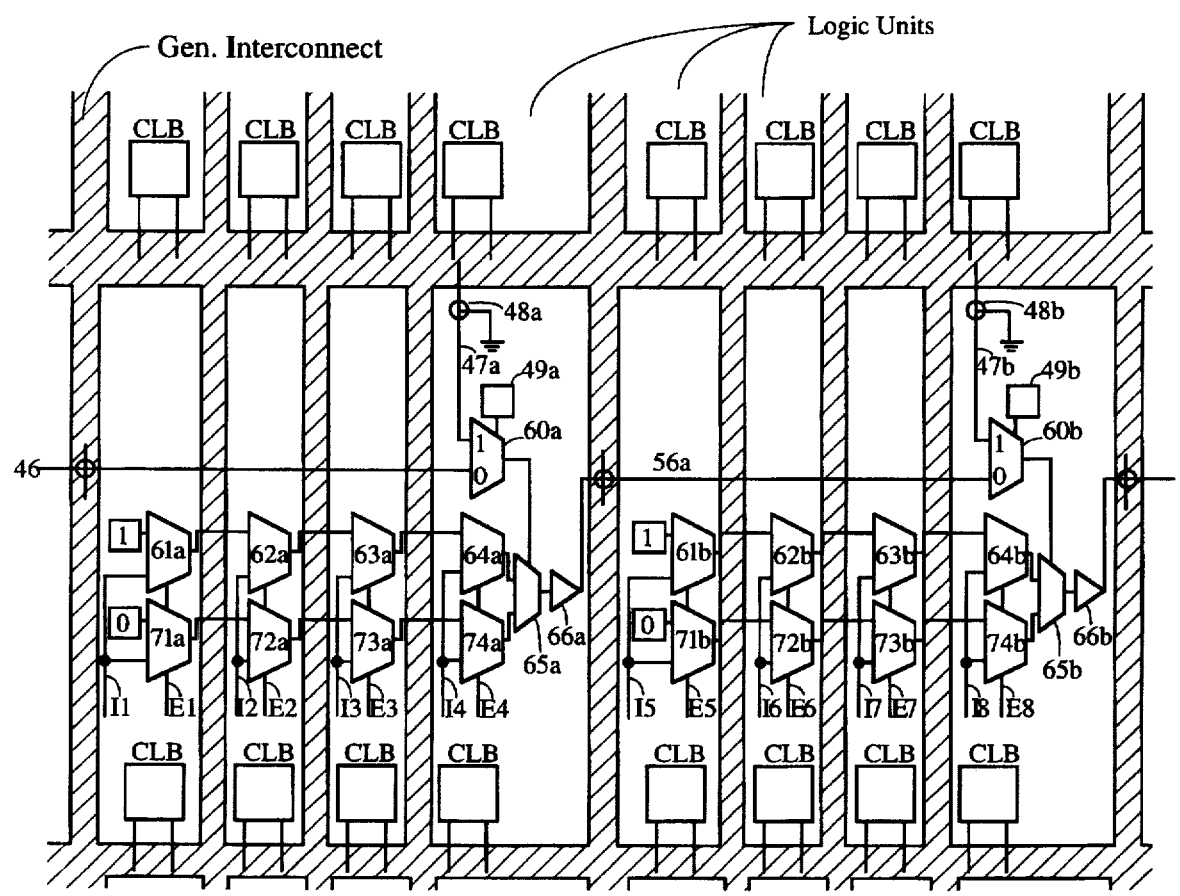
FIG. 6 shows a structure with a lookahead circuit for shortening the delay of the multiplexer chain.

With the structure of FIG. 5, the delay caused by a long chain of multiplexers may be undesirably large. FIG. 6 shows an FPGA with a lookahead structure for shortening the delay of the multiplexer chain. Two parallel chains of multiplexers 61–64 and 71–74 receive leading 1 and 0 respectively and provide their respective output signals to the multiplexer to the right, eventually to multiplexer 65. If the output of multiplexer 60a is 1, the chain with the leading 1 (1-chain) is selected, that is, the output of multiplexer 64 is selected by multiplexer 65. If the output of multiplexer 60a is 0, the 0-chain is selected, that is, the output of multiplexer 74 is selected. The structure of FIG. 6 allows the output of multiplexer 60 to control multiplexer 65 without encountering the signal path delay of FIG. 5.

Figure 7:
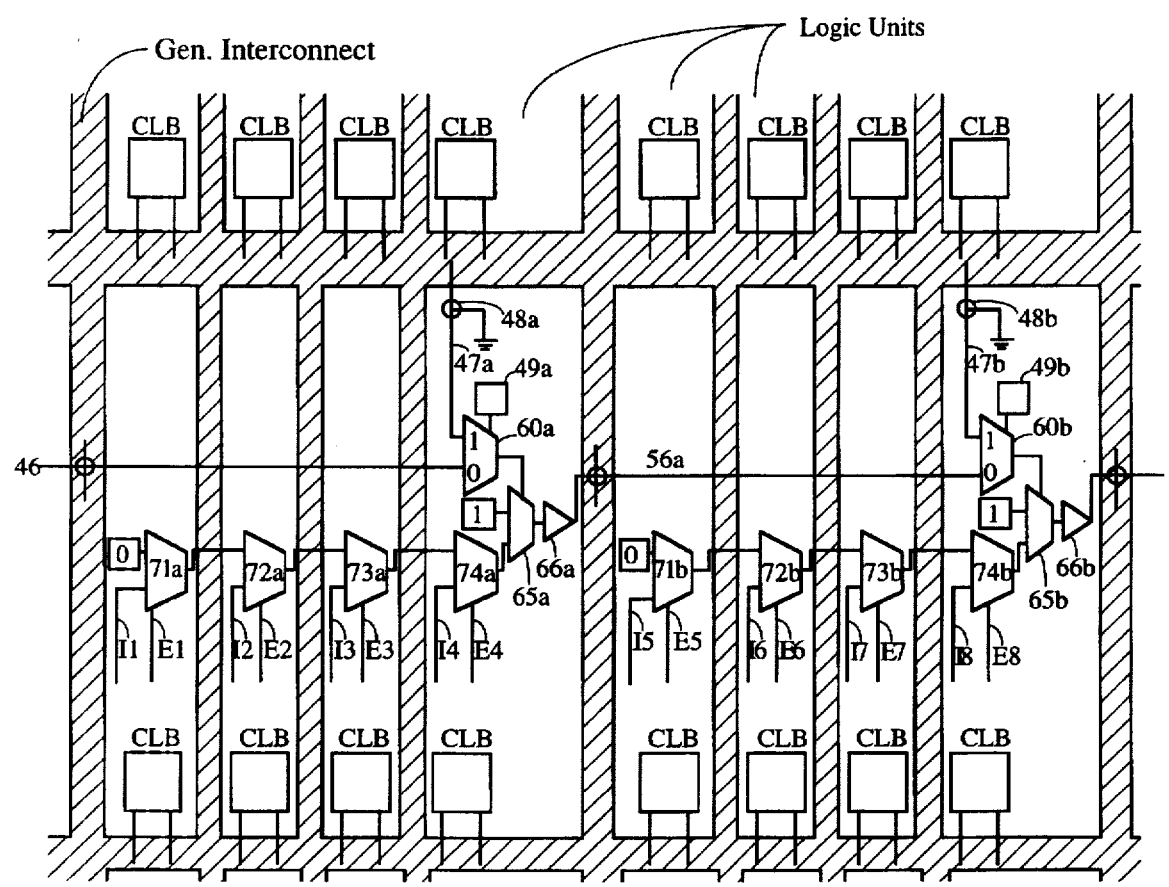
FIG. 7 shows how the circuit of FIG. 6 can be simplified without any loss of function.

FIG. 7 shows how the circuit of FIG. 6 can be simplified without any loss of function. In FIG. 6, if any of signals I1 through I4 is to be placed onto the bus, its enable line E1 through E4 will be high. The functionality of a tristate bus line requires that the design cause all other enable signals to be inactive, and thus the logic 0 which initiated the chain is propagated to multiplexer 60a. Thus, the output from multiplexer 60a should be logic 0, causing the 0-chain to be selected by multiplexer 65a. Only if a logic 1 is being propagated from the left will multiplexer 60a cause multiplexer 65a to select the 1-chain. And when the 1-chain is selected, this means that a multiplexer to the left was enabled and its input signal was logic 1. This requires that all enable signals E1 through E4 be inactive. So whenever the 1-chain is selected, the constant logic 1 input signal will propagate to multiplexer 65a. Thus the 1-chain is not needed. In FIG. 7, the 1-chain comprising multiplexers 61a–64a is eliminated and the memory cell initiating the 1-chain becomes a direct input to multiplexer 65a.

Memory cells can be used to load the 0 or 1 into the input of multiplexer 71a and multiplexer 65a, and therefore these structures are programmable. Thus, the structure illustrated in FIG. 7 can be used for other functions than a tristate buffer, in particular to generate AND and OR functions, by loading different values into the inputs of multiplexers 71a and 65a.

Figure 8:
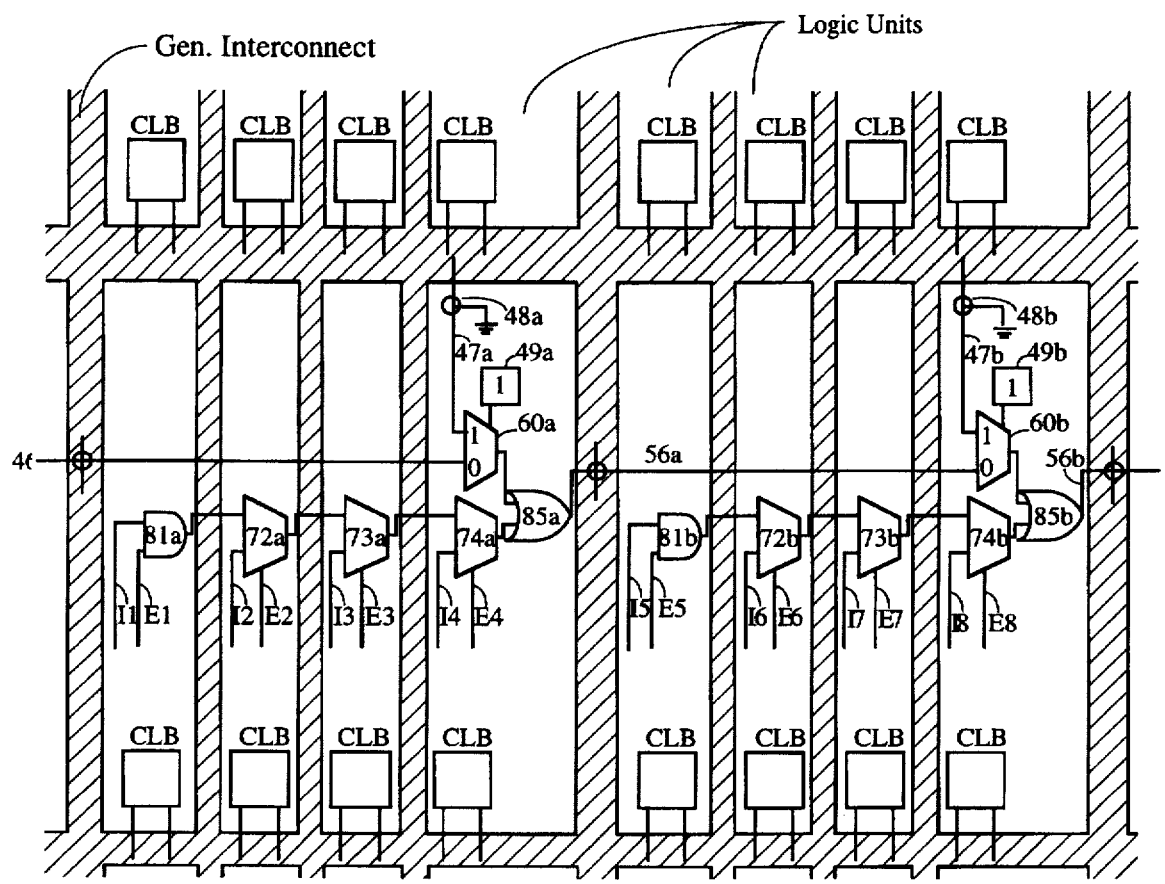
FIG. 8 shows a further simplification from FIG. 7.

FIG. 8 shows a further simplification from FIG. 7. A multiplexer with a constant 0 input can be replaced by an AND gate. Thus AND gate 81a of FIG. 8 replaces multiplexer 71a and the leading 0 memory cell of FIG. 7. A multiplexer with a constant 1 input can be replaced by an OR gate. Thus multiplexer 65a and the logic 1 memory cell are replaced by OR gate 85a. Because an OR gate provides a buffered output signal, buffer 66a of FIG. 7 can also be eliminated. A signal starting to the left of line 46 and propagating to a point to the right of bus line 56b is delayed only by the pass transistor in multiplexer 60a, the drive transistor in OR gate 85a, the pass transistor in multiplexer 60b and the drive transistor in OR gate 85b. Thus the path is faster than that of FIG. 5.

FIGS. 9-13 show examples of how the structure of FIG. 8 can implement some designs.

Figure 9:
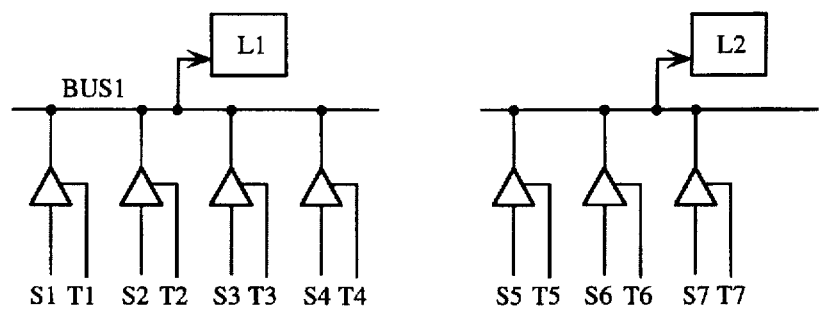
FIG. 9 represents part of a user's design.

FIG. 9 represents part of a user's design, namely two logic devices, L1 and L2, each of which can alternately receive one of several input signals. Logic device L1 is to receive one of input signals S1 through S4 and logic device L2 is to receive one of input signals S5 through S7. The user has indicated that the signal for logic device L1 will be placed onto bus BUS1 and the signal for logic device L2 will be placed onto bus BUS2. Selection of signals S1 through S7 is to be controlled by tristate control signals T1 through T7, respectively.

Figure 10:
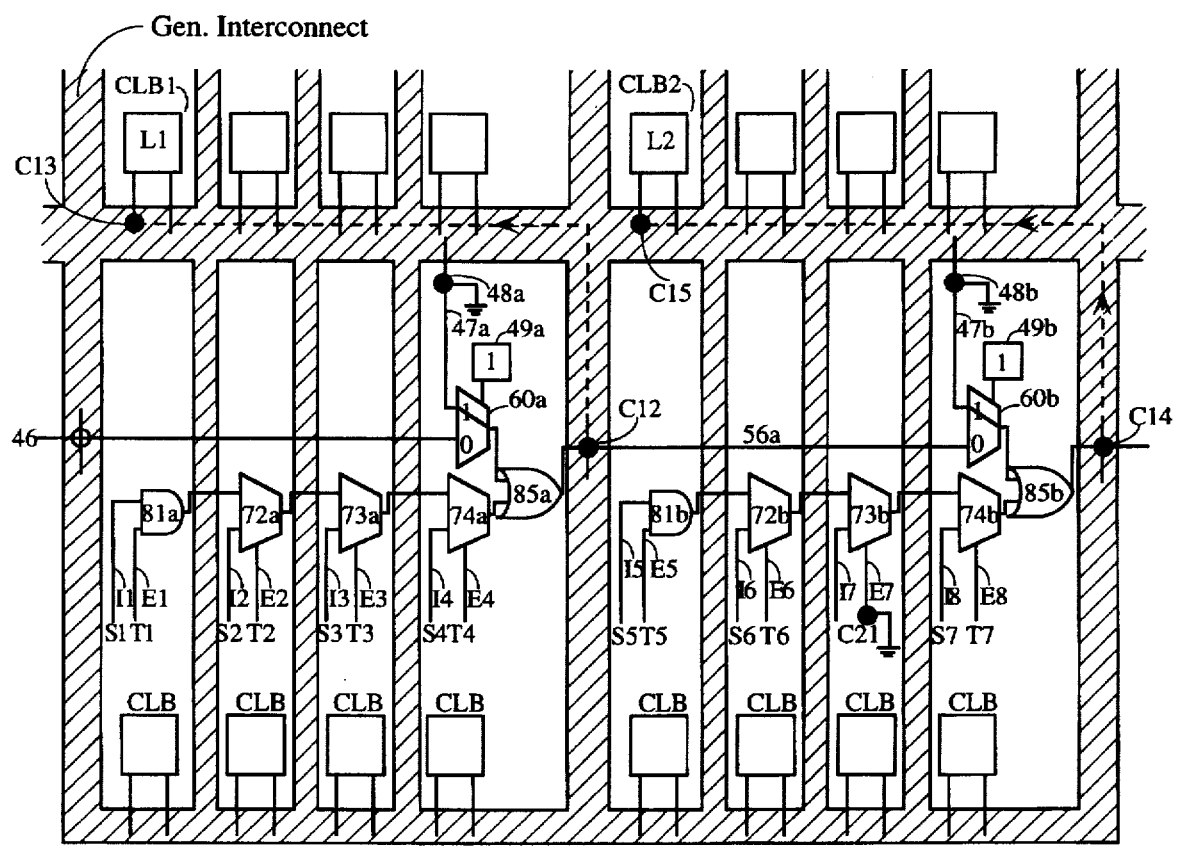
FIG. 10 shows how the structure of FIG. 8 will implement the design of FIG. 9.

FIG. 10 shows how the structure of FIG. 8 will implement the design of FIG. 9. Memory cell 49a is loaded with a logic 1 and a ground signal is applied to line 47a through connector 48a. This causes multiplexer 60a to forward the ground signal to OR gate 85a and thus causes OR gate 85a to respond to the multiplexer chain comprising AND gate 81a and multiplexers 72a through 74a. Bus line 56a is connected to the general interconnect structure at connector C12. Interconnections not shown form the path illustrated in dashed lines from connector C12 to connector C13. Connector C13 connects the interconnect structure to configurable logic block CLB1, which is configured to implement logic L1. Signals S1 through S4 are applied to lines I1 through I4 and tristate control signals T1 through T4 are applied to enable lines E1 through E4. This implements the left portion of FIG. 9.

To implement the right portion of FIG. 9, a logic 1 is loaded into memory cell 49b so that bus line 56a will not be connected to OR gate 85b. A ground signal is applied through connector 48b and multiplexer 60b to OR gate 85b so that OR gate 85b will respond to the multiplexer chain comprising AND gate 81b and multiplexers 72b, 73b, and 74b. A ground signal is applied to enable line E7 of multiplexer 73b through connector C21 so that input line I7 will be ignored and the signal from multiplexer 72b will be passed to multiplexer 74b. (This assumes the software has decided that the logic illustrated in FIG. 9 fits better with the total logic placement when multiplexer 73b is skipped.) Connections are made at C14 and C15, thus applying the output of OR gate 85b to configurable logic block CLB2, which is programmed to implement logic L2. Signals S5 and S6 are applied to I5 and I6. Signal S7 is applied to input line I8. Tristate control signals T5 and T6 are applied to enable lines E5 and E6. Tristate control signal T7 is applied to enable line E8. Thus the configuration of FIG. 10 implements the logic design portions shown in FIG. 9.

Figure 11:
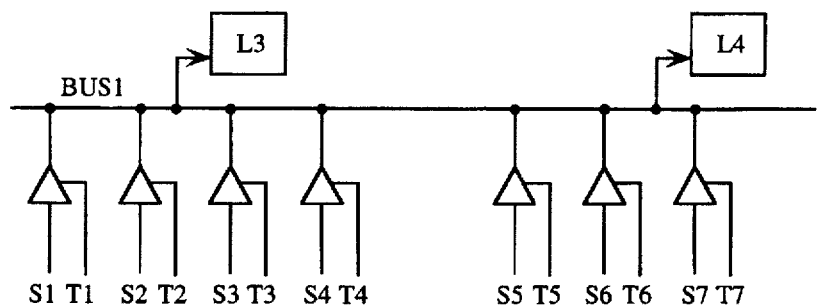
FIG. 11 illustrates part of another design.
Figure 12:
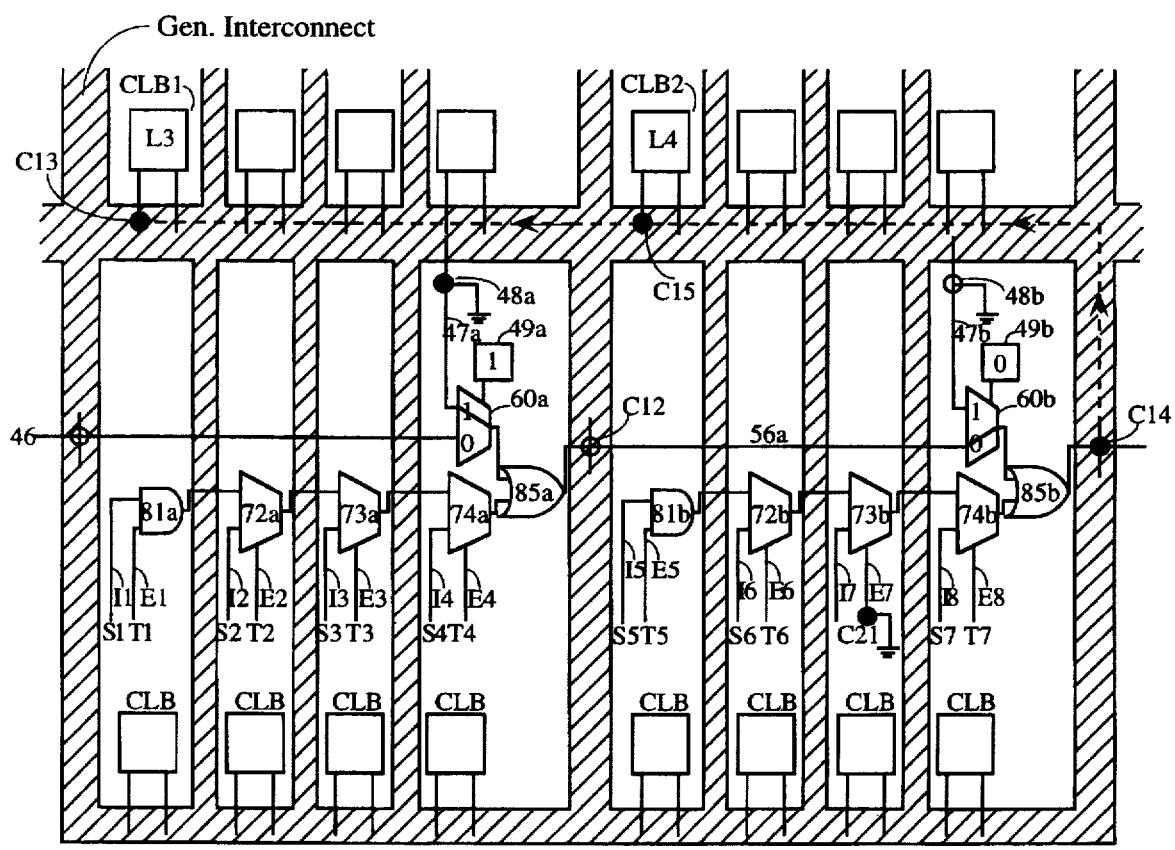
FIGS. 12 and 13 illustrate two ways the design portion of FIG. 11 can be implemented.
Figure 13:
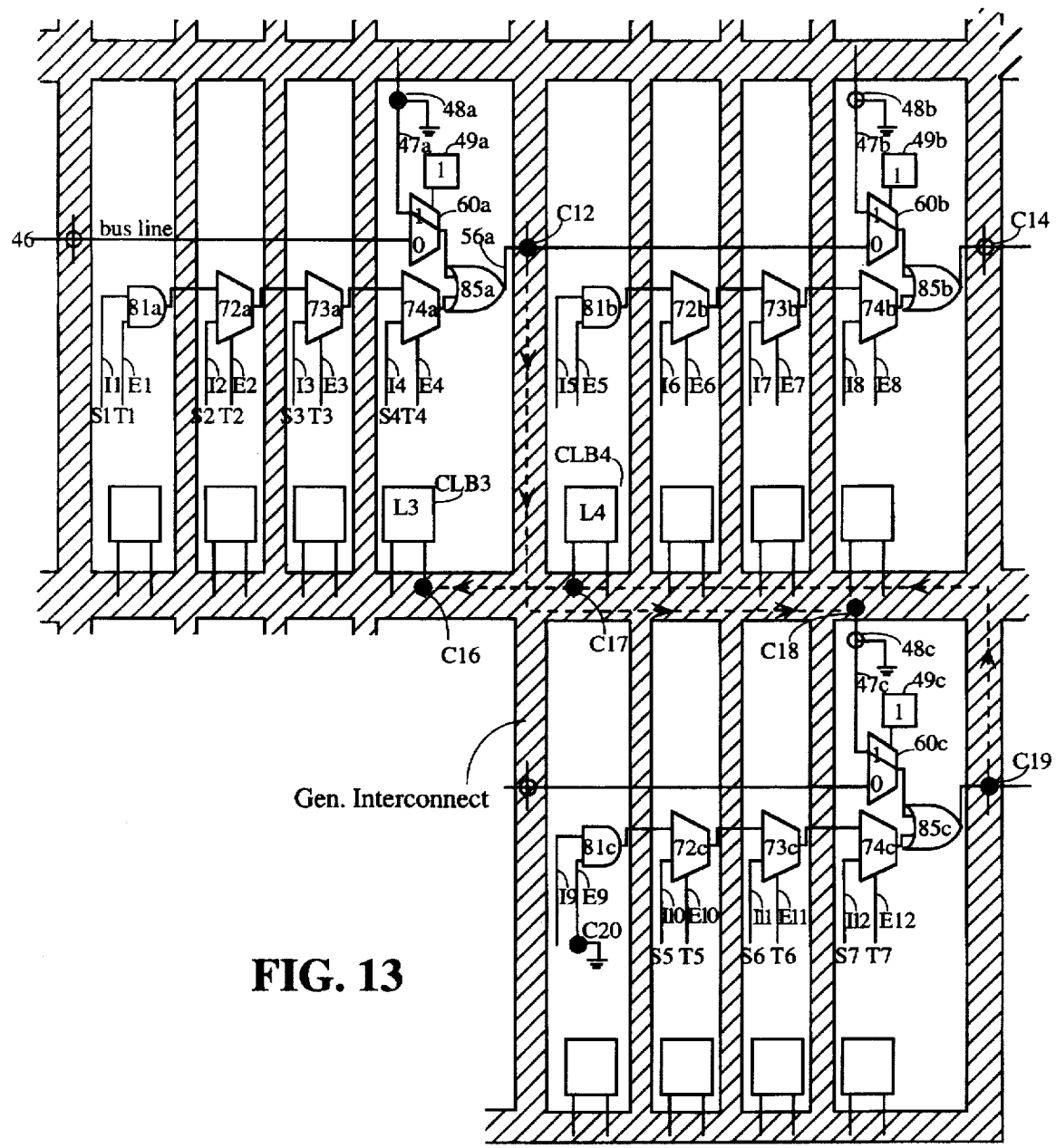

FIG. 11 illustrates part of another design. FIGS. 12 and 13 illustrate two ways this design portion can be implemented. The design of FIG. 11 selects from seven input signals S1 through S7, and provides the selected signal to both of logic elements L3 and L4.

In FIG. 12, connector C12 is not used to connect line 56a to the interconnect structure. The left portion of the structure is configured as in FIG. 10. On the right, memory cell 49b is loaded with a logic 0 so that the output signal from OR gate 85a is applied to OR gate 85b. As in FIG. 10, multiplexer 73b is bypassed. The output of OR gate 85b is applied to the interconnect structure by turning on connector C14. A path is formed through the interconnect structure and through connectors C13 and C15 to configurable logic blocks CLB1 and CLB2, which implement logic portions L3 and L4.

Note that OR gate 85b will provide a logic 1 output signal if the input signal S1 through S7 is high when the corresponding tristate enable signal T1 through T7 is high. Or gate 85b will provide a logic 0 output signal if the input signal S1 through S7 is low when the corresponding tristate enable signal T1 through T7 is high. If no enable signal is high, OR gate 85B will provide a logic 0 output signal.

FIG. 13 illustrates an alternative implementation of the same logic, and illustrates that the input signals for driving a bus need not be placed along the same line. Signals S1 through S4 are placed on lines I1 through I4, as before. However, signals S5 through S7 have been placed onto lines I10 through I12 in another row.

As before, connector C12 connects line 56a to the general interconnect. A path is found through the general interconnect from connector C12 to connector C18, to provide the output signal from OR gate 85a to line 47c, which is on another row and another column. Memory cell 49c is loaded with a logic 1 to forward the signal to OR gate 85c. Enable line E9 is connected to ground through connector C21, so input line I9 is ignored. Signals S5 through S7 are placed onto lines I10 through I12 and tristate control signals T5 through T7 are placed onto enable lines E10 through E12. Connector C19 places the output of OR gate 85c onto the general interconnect structure. Connectors C16 and C17 forward the signal from the general interconnect structure to CLB3 and CLB4. CLB3 will implement logic L3 and CLB4 will implement logic L4. As the signal travels through the interconnect structure it may be buffered as needed. Thus a bus line can be formed using general interconnect line segments in combination with the fast lines such as 56a for connecting adjacent segments. This increases the flexibility of the FPGA for placing large designs compactly into the FPGA.

Figure 14:
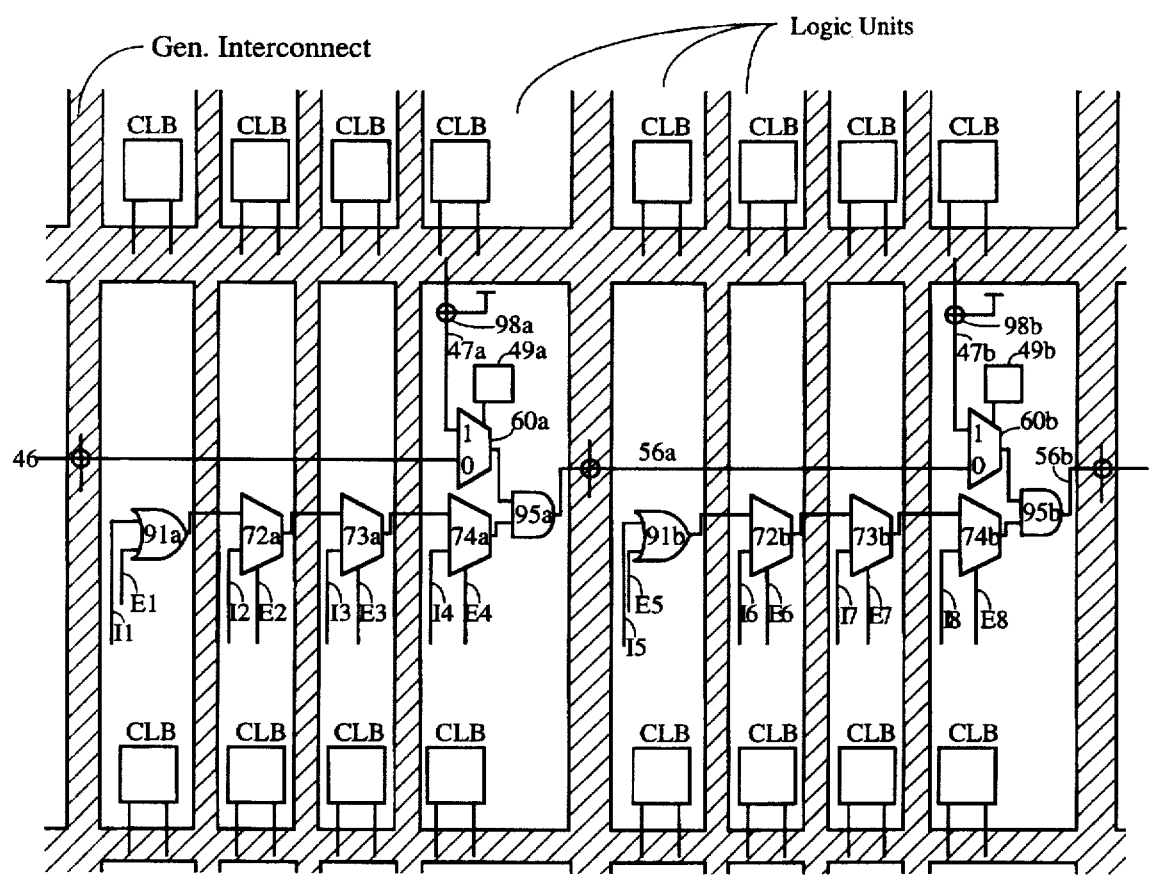
FIG. 14 shows another embodiment similar to FIG. 8.

It is clear from the above description that the present invention allows a bus line to be formed from a combination of interconnect lines which do not have to be in a particular relationship to each other. From the simple examples shown, one of ordinary skill in the art will understand how to implement many other designs in many arrangements. For example, in FIG. 8, AND gate 81 at the beginning of a chain and OR gate 85 at the end of a chain can alternatively be implemented as an OR gate at the beginning and an AND gate at the end of a chain as shown in FIG. 14. Of course, the ground signal at connector 48a of FIG. 8 must be replaced by a Vcc signal at connector 98a in order to cause AND gate 95a to pass the multiplexer chain signal. Also, even though the illustration groups input lines into sets of four, another number may be chosen. Such alternative embodiments are intended to fall within the scope of the present invention.

We claim:

1. A plurality of multiplexer chains each comprising:

a plurality of multiplexers connected into a chain with an output terminal of one multiplexer being connected to an input terminal of a next multiplexer and an input signal being connected to an input terminal of each multiplexer, each multiplexer being controlled by a tristate enable signal on a multiplexer control terminal;

means for connecting to each chain a signal derived from an FPGA interconnect structure;

means for connecting an output signal of each chain to said FPGA interconnect structure.

2. A plurality of multiplexer chains as in claim 1 in which said means for connecting an output signal of each chain to said FPGA interconnect structure comprises means for selecting between connecting to said FPGA interconnect structure an output terminal of said each chain and an output terminal of another chain in an adjacent position.

3. A plurality of multiplexer chains as in claim 2 in which said each chain is initialized with a constant value.

4. A plurality of multiplexer chains as in claim 3 in which said constant value is provided by implementing a first multiplexer as an AND gate and said means for connecting an output terminal of each chain to the output terminal of another chain in an adjacent position comprises an OR gate.

5. A plurality of multiplexer chains as in claim 3 in which said constant value is provided by implementing a first multiplexer as an OR gate and said means for connecting an output terminal of each chain to the output terminal of another chain in an adjacent position comprises an AND gate.

6. A plurality of multiplexer chains as in claim 1 in which said signal derived from said FPGA interconnect structure is connected to an input terminal of a first multiplexer in each chain.

7. A plurality of multiplexer chains as in claim 1 in which said signal derived from said FPGA interconnect structure is multiplexed with an output signal from a last multiplexer in each chain.

* * * * *